(12) United States Patent
Ismayilov et al.

(10) Patent No.: US 9,451,719 B2
(45) Date of Patent: Sep. 20, 2016

(54) U FORM-FACTOR INTELLIGENT ELECTRONIC DEVICE (IED) HARDWARE PLATFORM WITH MATCHING OF IED WIRING, FROM A NON U FORM-FACTOR IED HARDWARE PLATFORM USING ADAPTER STRUCTURE

(71) Applicant: ABB Technology AG, Zurich (CH)

(72) Inventors: Shamsi Ismayilov, Conshohocken, PA (US); Yaser A. Khalifa, New Paltz, PA (US); Frantisek Koudelka, Brno (CZ); Arkady Oksengorn, Boca Raton, FL (US); Siu Lau, Hampton, NJ (US); Hardik Patel, Bethlehem, PA (US); In Y. Choi, Plymouth Meeting, PA (US)

(73) Assignee: ABB Technology AG, Zurich (CH)

( * ) Notice: Subject to any disclaimer, the term of this patent is extended or adjusted under 35 U.S.C. 154(b) by 225 days.

(21) Appl. No.: 14/013,064

(22) Filed: Aug. 29, 2013

(65) Prior Publication Data

US 2015/0062832 A1    Mar. 5, 2015

(51) Int. Cl.

| H05K 7/00 | (2006.01) |
|---|---|
| H05K 7/02 | (2006.01) |
| H05K 13/00 | (2006.01) |
| H05K 7/14 | (2006.01) |

(52) U.S. Cl.
CPC .............. *H05K 7/026* (2013.01); *H05K 7/1425* (2013.01); *H05K 13/0023* (2013.01); *Y10T 29/49128* (2015.01)

(58) Field of Classification Search
CPC ........................... H05K 7/026; H05K 13/0023
See application file for complete search history.

(56) References Cited

U.S. PATENT DOCUMENTS

| 5,159,534 | A | * | 10/1992 | Hudson et al. ................ 361/730 |
| 5,168,424 | A | * | 12/1992 | Bolton et al. ................. 361/695 |
| 5,557,506 | A | * | 9/1996 | Wood et al. ................... 361/796 |
| 5,570,270 | A | * | 10/1996 | Naedel et al. ............ 361/679.46 |
| 5,943,202 | A | * | 8/1999 | Beckwith ........................ 361/66 |
| 5,982,652 | A | * | 11/1999 | Simonelli ............... H02J 9/062 307/26 |
| 6,243,273 | B1 | | 6/2001 | Beun |
| 6,572,403 | B2 | * | 6/2003 | Reimund ............ H01R 25/006 439/507 |

(Continued)

FOREIGN PATENT DOCUMENTS

| EP | 0653906 A1 | 5/1995 | |
| EP | 2 246 954 A1 | * 11/2010 | ............... H02H 3/00 |

(Continued)

OTHER PUBLICATIONS

International Search Report & Written Opinion in PCT/US2014/052597 dated Dec. 15, 2014.

*Primary Examiner* — Hoa C Nguyen
*Assistant Examiner* — Xanthia C Cunningham
(74) *Attorney, Agent, or Firm* — Manelli Selter PLLC; Edward J. Stemberger

(57) ABSTRACT

A method and apparatus provides an Intelligent Electronic Device (IED) with new hardware modules. Hardware modules are provided that are configured for electrically connecting with connections of a first IED housing that has a first form factor. A second IED housing is provided having a second form factor that is different from the first form factor. The hardware modules are mounted in the second housing. Adaptor structure is employed to electrically connect the hardware modules with connections of the second housing. The second housing is mounted into an existing wiring and second form factor environment.

11 Claims, 3 Drawing Sheets

(56) References Cited

U.S. PATENT DOCUMENTS

| | | | |
|---|---|---|---|
| 6,611,424 B2* | 8/2003 | Huang | 361/679.39 |
| 6,830,458 B2* | 12/2004 | Kobayashi | G06F 1/184 |
| | | | 361/679.58 |
| 6,994,561 B2* | 2/2006 | Pepe | H01R 9/2491 |
| | | | 361/796 |
| 7,027,298 B2* | 4/2006 | Wu et al. | 361/679.37 |
| 7,064,962 B2* | 6/2006 | Wang et al. | 361/789 |
| 7,167,380 B2* | 1/2007 | Ice | 361/796 |
| 7,257,886 B2* | 8/2007 | Haager et al. | 29/739 |
| 7,333,606 B1* | 2/2008 | Swam | H04Q 1/10 |
| | | | 379/413.02 |
| 7,339,786 B2* | 3/2008 | Bottom et al. | 361/679.41 |
| 7,522,424 B2* | 4/2009 | Mambakkan et al. | 361/737 |
| 7,656,669 B2* | 2/2010 | Lee et al. | 361/732 |
| 7,882,220 B2* | 2/2011 | Wimmer | 709/224 |
| 8,013,702 B2* | 9/2011 | Haj-Maharsi et al. | 336/12 |
| 8,369,092 B2* | 2/2013 | Atkins et al. | 361/727 |
| 8,385,075 B2* | 2/2013 | Loucks | 361/728 |
| D683,706 S | 6/2013 | Kangas | |
| 8,576,570 B2* | 11/2013 | Nguyen et al. | 361/730 |
| 8,787,004 B2* | 7/2014 | Di Maio et al. | 361/634 |
| 2001/0012733 A1 | 8/2001 | Schmidt | |
| 2002/0135987 A1* | 9/2002 | Baldwin et al. | 361/730 |
| 2005/0052805 A1* | 3/2005 | Sato et al. | 361/90 |
| 2005/0248916 A1* | 11/2005 | Huang | 361/685 |
| 2006/0221559 A1* | 10/2006 | Campini et al. | 361/679 |
| 2007/0147011 A1* | 6/2007 | Sheffield | 361/730 |
| 2007/0293954 A1* | 12/2007 | Pfingsten et al. | 700/22 |
| 2008/0007909 A1* | 1/2008 | Merkin et al. | 361/685 |
| 2008/0037218 A1* | 2/2008 | Sharma et al. | 361/695 |
| 2008/0068789 A1* | 3/2008 | Pav et al. | 361/687 |
| 2008/0235355 A1* | 9/2008 | Spanier et al. | 709/219 |
| 2008/0239649 A1* | 10/2008 | Bradicich et al. | 361/683 |
| 2008/0298014 A1* | 12/2008 | Franco | 361/688 |
| 2009/0096654 A1* | 4/2009 | Zhu et al. | 341/155 |
| 2009/0273896 A1* | 11/2009 | Walker et al. | 361/679.33 |
| 2010/0008053 A1 | 1/2010 | Osternack | |
| 2010/0271794 A1* | 10/2010 | Gloor et al. | 361/788 |
| 2011/0058341 A1 | 3/2011 | Wu | |
| 2011/0267761 A1* | 11/2011 | Peng et al. | 361/679.31 |
| 2011/0304966 A1* | 12/2011 | Schrempp | 361/679.4 |
| 2012/0020008 A1* | 1/2012 | Dunwoody et al. | 361/679.46 |
| 2013/0039017 A1* | 2/2013 | Lichoulas et al. | 361/730 |
| 2013/0058037 A1* | 3/2013 | Brandyberry et al. | 361/679.46 |
| 2013/0104592 A1* | 5/2013 | Cottet et al. | 62/419 |
| 2013/0135823 A1* | 5/2013 | Kim et al. | 361/697 |
| 2013/0314865 A1* | 11/2013 | Chuang et al. | 361/679.02 |
| 2013/0342988 A1* | 12/2013 | Peng et al. | 361/679.33 |
| 2015/0009616 A1* | 1/2015 | Adrian et al. | 361/679.32 |

FOREIGN PATENT DOCUMENTS

| | | |
|---|---|---|
| EP | 2246954 A1 | 11/2010 |
| EP | 2389054 | 11/2011 |
| WO | 03063565 A1 | 7/2003 |
| WO | 2004100633 | 11/2004 |
| WO | 2004100634 | 11/2004 |
| WO | 2004100635 | 11/2004 |

* cited by examiner

U FORM-FACTOR INTELLIGENT ELECTRONIC DEVICE (IED) HARDWARE PLATFORM WITH MATCHING OF IED WIRING, FROM A NON U FORM-FACTOR IED HARDWARE PLATFORM USING ADAPTER STRUCTURE

FIELD

The invention relates to intelligent Electronic Devices (IED) and, more particularly, to the integration of state of the art IED technology into an existing wiring and form factor environment.

BACKGROUND

Intelligent Electronic Devices (IED) are typically used for protection, management and supervision of utility substations and industrial power systems. IEDs are durable electronic equipment that, during their designed life, would span across a number of technological advancements and changes. These changes could affect not only the hardware electronics, but also the form factor and size of that hardware. Replacing older IEDs with similar ones is quite difficult since technologies used in the original IED are outdated and components have reached their End Of Life (EOL). Replacing an older technology IED with a more recent one very often requires changing wiring and sometimes dimensions of racks and panels if a new IED form factor is introduced or a different user Input/output interface is used.

Thus, there is a need to permit the transfer and integration of current technology into and an IED having an older type form-factor while keeping the customer wiring locations unchanged.

SUMMARY

An object of the invention is to fulfill the need referred to above. In accordance with the principles of the present invention, this objective is obtained by a method that provides an Intelligent Electronic Device (IED) with new hardware modules. Hardware modules are provided that are configured for electrically connecting with connections of a first IED housing that has a first form factor. A second IED housing is provided having a second form factor that is different from the first form factor. The hardware modules are mounted in the second housing. Adaptor structure is employed to electrically connect the hardware modules with connections of the second housing. The second housing is mounted into an existing wiring and second form factor environment.

In accordance with another aspect of the disclosed embodiment, An Intelligent Electronic Device (IED) includes a plurality of hardware modules configured for directly electrically connecting with connections of a first IED housing that has a first form factor. A second IED housing has a second form factor that is different from the first form factor. The hardware modules are mounted within the second housing. Adaptor structure is constructed and arranged to electrically connect the hardware modules with connections of the second housing.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF EXEMPLARY EMBODIMENTS

Figure 1A:
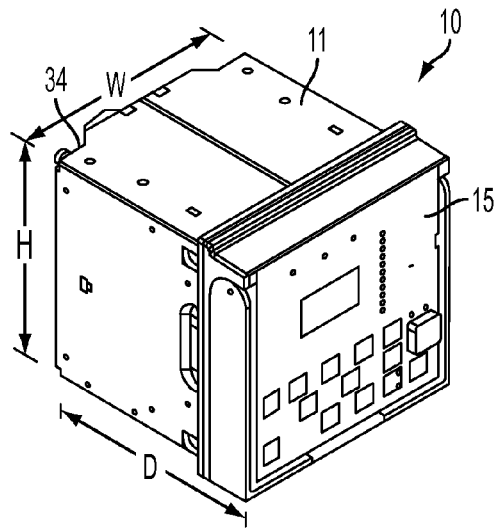
FIG. 1A is a perspective view of an IED having a particular form factor for vertically mounted hardware modules.
Figure 1B:
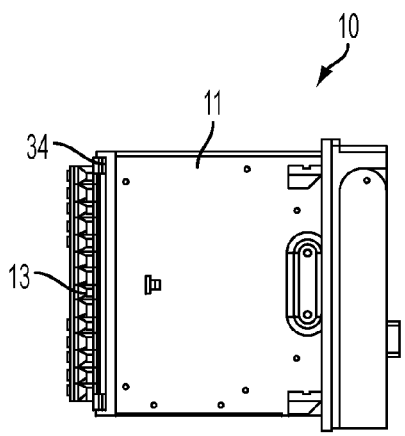
FIG. 1B is a side view of the IED of FIG. 1A.

With reference to FIGS. 1A and 1B, an IED is shown, generally indicated at 10, having a housing 11 with a form factor enabling mounting of hardware modules (not shown) in a vertical arrangement therein. The modules are directly electrically connected to connections 13 at a rear of the IED 10 and to connectors (not shown) adjacent to the front panel 15. The IED 10 has a height H of 6.97", a width W of 6.97" and a depth D of 7.91". The IED 10 is used for protection, management and supervision of utility substations and industrial power systems.

Figure 2:
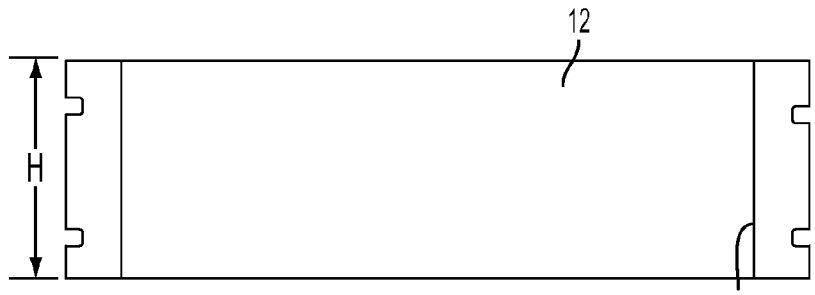
FIG. 2 is front view of a housing for an IED having a form factor for horizontal mounting of hardware modules.
Figure 3:
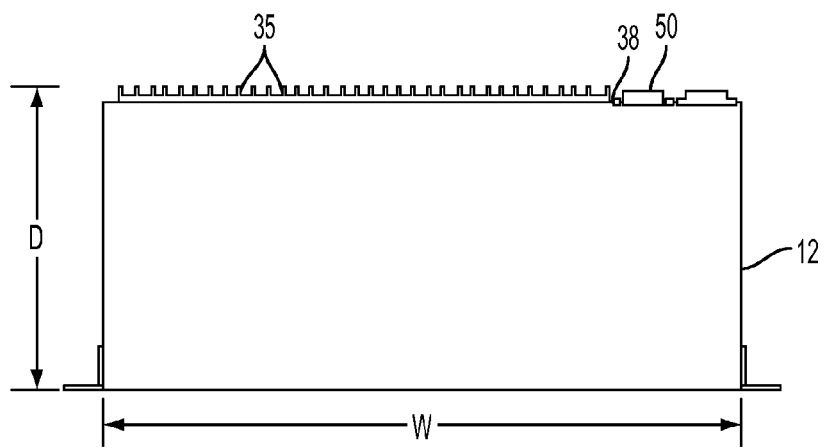
FIG. 3 is a top view of the IED housing of FIG. 2.

As noted above, there are times when replacing older IEDs with newer ones is needed. FIGS. 2 and 3 shows an older type IED housing 12 that has a form factor for enabling the hardware modules to be mounted in a horizontal arrangement therein. The housing 12 of the embodiment has a height H of 5.22", a width W of 17.12" and a depth D of 9.00" (for 19" U form-factor). Below, a process and components are described that enables the hardware modules made for the IED of FIGS. 1A, 1B to be used in the housing 12 of FIGS. 2 and 3 so that the customer can transfer and integrate current technology into an older type IEDs form factor, while advantageously keeping the customer wiring locations unchanged.

Figure 4:
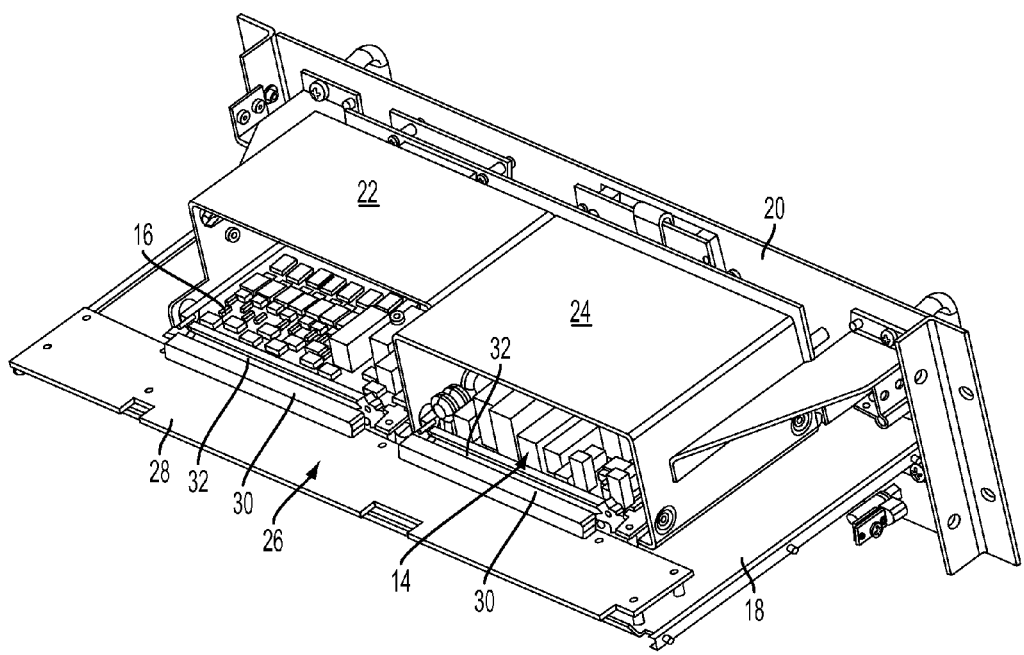
FIG. 4 is a rear perspective view of hardware modules connected with a front panel for an IED having the form factor of FIGS. 2 and 3, and also connected with a first adaptor structure, in accordance with an embodiment.
Figure 5:
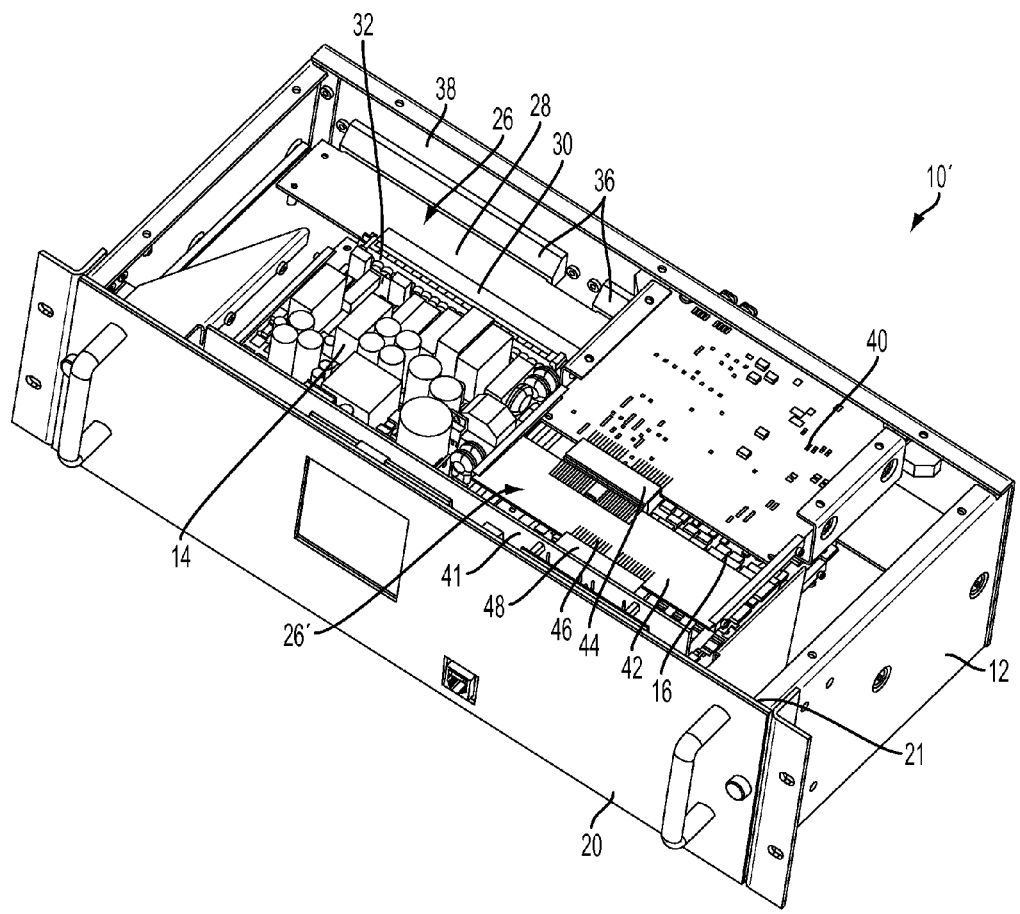
FIG. 5 is a front perspective view of the hardware modules of FIG. 4 along with a communication module shown disposed an IED housing having the form factor of FIGS. 2 and 3, and connected with a second adaptor structure, in accordance with the embodiment.

With reference to FIG. 4, a Power Supply Module (PSM) or circuit board, generally indicated at 14, and a Binary Input/Output (BIO) circuit board or module, generally indicated at 16, are shown mounted in a horizontally adjacent manner to a tray 18 that is coupled to a front panel 20. The new front panel 20, for operator input, is coupled to an open end 21 of the housing 12 (FIG. 2). A protective cover 22 is provided over the module 16 and a second protective cover 24 is provided over the module 14. The modules 14 and 16 are of the type configured for vertical mounting in housing 11 (FIG. 1A) and include current or updated technology. To be used in the older type housing 12 and mounted horizontally adjacent therein, first adaptor structure, generally indicated at 26 is provided. In the embodiment, the first adaptor structure is preferably a rigid printed circuit board 28 having connectors 30 thereon that receive mating connectors 32 of the modules 14 and 16, which would otherwise been connect directly to connectors 13 associated with the back panel 34 of the IED 10 of FIG. 1B. With reference to FIG. 5, the circuit board 28 is also connected to connectors 36 that are associated with certain of the connections 35 (FIG. 3) on the back panel 38 of the housing 12. Thus, the circuit board 28 bridges the physical gap between the modules 14 and 16 and the back panel 34. Connection between PSM and BIO modules to the external Input/outputs is achieved through the circuit board 28. It is noted that the covers 22 and 24 are not shown in FIG. 5 for clarity of illustration.

With reference to FIG. 5, a second adaptor structure 26' is employed to connect the communication (COM) circuit board or card 40 to the backplane 41 rather than connecting the COM card 40 directly to the backplane as in the IED 10 of FIG. 1A. In the embodiment, the second adaptor structure 26' is preferably a rigid printed circuit board 42 having a connector 44 that receives a mating portion of the COM card 40. A portion 46 of the circuit board 42 is electrically received by a connector 48 of the backplane 41, which is adjacent to the front panel 20 of the housing 12. Thus, the circuit board 42 bridges the physical gap between the COM card 40 and the backplane 41. This arrangement facilitates the access of the COM ports 50 (FIG. 3) from the back panel 38 by providing the ports 50 in the same plane like other rear terminals.

Thus, the utilization of the adapter structures 26, 26' to electrically connect the hardware modules (configured for a first form factor) within the housing 12 (configured for a second form fact that is different from the first form factor), allows power utilities to adopt state of the art technology for their IEDs, without the need to change the physical wiring locations and input/output interface associated with the housing 12.

One of the challenging tasks of any electrical enclosure is electrical grounding. The adaptor structures used in the embodiment are used to extend user interface inputs and outputs from one form factor to another. Appropriate grounding of the adaptor structures can be achieved with the use of springs, brackets, or the like.

Instead of using circuit boards as the first and second adaptor structures, ribbons, flexible cables, or flexible circuit boards can be employed having the appropriate electrical connections.

Advantages and benefits of the embodiment include:
1) IED users will be able to integrate state of the art technological advancement in the IED industry in existing environments (e.g., racks of the form factor of housing 12) without having to re-wire and change input/output interfacing to their existing IEDs.
2) Since these newer IEDs are compatible in form-factor and are wire-alike, they will allow a drop-in replacement which will shorten the IED replacement time, and hence the outage time for such replacement.
3) Since these newer IEDs provide customers with state-of-the-art technology with a reduced replacement overhead, they will give the manufacturer an edge for faster and more efficient retrofit application of their products into the market.
4) The adaptor structure 26, 26' application will allow the use of hardware modules configured for an IED (X) having one form factor, to be used for another IED (Y) with a different form factor. The adaptor structures will allow IED (X) to be wired-alike and form-factor-alike as the IED (Y).
5) The flexibility to adopt any hardware of one form-factor to a different IED form factor and wire-alike mentioned in (4) could be extended to allow adaptability between any two IEDs regardless of their manufacturer.
6) Using platform PCBs designed for different form-factors without any PCB modifications makes it possible to use same module and product testing harnesses and tools for new the products.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A method of providing an Intelligent Electronic Device (IED) with new hardware modules, the method comprising:
    providing hardware modules configured for directly electrically connecting with connections of a first IED housing that has a first form factor,
    providing a second IED housing having a second form factor that is different from the first form factor,
    mounting the hardware modules in the second housing, and
    employing adaptor structure to electrically connect the hardware modules with connections of the second housing,
    wherein the step of providing hardware modules includes providing a Power Supply Module (PSM) and a Binary Input/Output (BIO) module, and the step of employing the adaptor structure includes electrically connecting a first adaptor structure between the PSM module and the BIO module, and connectors at a back panel of the second housing,
    wherein the method further comprises the steps of:
    providing a communication (COM) card having communication ports accessible at a back panel of the second housing, and
    employing a second adaptor structure electrically connected between the COM card and a connector of a backplane adjacent to a front panel of the second housing.

2. The method of claim 1, wherein the step of employing adaptor structure includes employing at least one printed circuit board.

3. The method of claim 1, wherein the first form factor is defined by the first housing having a height of 6.97", width of 6.97" and depth of 7.91" and the second form factor is defined by the second housing having a height of 5.22", width of 17.12" and depth of 9.00".

4. The method of claim 3, wherein the step of providing the hardware modules incudes providing the hardware modules that are suitable for mounting the hardware modules in the first IED housing, and wherein the mounting step includes mounting the hardware modules in the second housing in a horizontally adjacent manner.

5. An Intelligent Electronic Device (IED) comprising:
    a plurality of hardware modules configured for directly electrically connecting with connections of a first IED housing that has a first form factor,
    a second IED housing having a second form factor that is different from the first form factor, the hardware modules being mounted within the second housing, and
    adaptor structure constructed and arranged to electrically connect the hardware modules with connections of the second housing,
    wherein the hardware modules include a Power Supply Module (PSM) and a Binary Input/Output (BIO) module, and the adaptor structure includes a first adaptor structure electrically connected between the PSM module and the BIO module and connectors at a back panel of the second housing, wherein the PSM and the BIO module are mounted on a tray coupled to a front panel, the front panel being coupled to an open end of the second housing, wherein the device further comprises:

a communication (COM) card having communication ports accessible at a back panel of the second housing, and a second adaptor structure electrically connected between the COM card and a connector of a backplane adjacent to the front panel.

6. The device of claim 5, wherein the adaptor structure includes at least one printed circuit board.

7. The device of claim 5, wherein the PSM and the BIO module are mounted on the tray in an adjacent horizontal manner.

8. The device of claim 5, wherein the first adaptor structure includes a first printed circuit board.

9. The device of claim 5, wherein the second adaptor structure includes a second printed circuit board.

10. The device of claim 5, wherein the first form factor is defined by the first housing having a height of 6.97", width of 6.97" and depth of 7.91" and the second form factor is defined by the second housing having a height of 5.22", width of 17.12" and depth of 9.00".

11. The device of claim 5, wherein the second IED housing is constructed and arranged so that the hardware modules are mounted in a horizontally adjacent manner therein.

\* \* \* \* \*